United States Patent [19]
Jackson et al.

[11] Patent Number: 5,580,382
[45] Date of Patent: Dec. 3, 1996

[54] PROCESS FOR FORMING SILICON DOPED GROUP III-V SEMICONDUCTORS WITH SIBR$_4$

[75] Inventors: Steven L. Jackson, San Jose, Calif.; Gregory E. Stillman, Urbana, Ill.

[73] Assignee: Board of Trustees of the University of Illinois, Ill.

[21] Appl. No.: 410,803

[22] Filed: Mar. 27, 1995

[51] Int. Cl.$^6$ ..................................................... C30B 29/40
[52] U.S. Cl. ............................ 117/104; 117/954; 117/956
[58] Field of Search .................................. 117/954, 956, 117/104

[56] References Cited

U.S. PATENT DOCUMENTS

| | | | |
|---|---|---|---|
| 2,840,489 | 6/1958 | Kempter et al. | |
| 4,504,331 | 3/1985 | Kuech et al. | 148/175 |
| 4,857,971 | 8/1989 | Bumhan. | |
| 4,988,640 | 1/1991 | Bohling et al. | 437/81 |
| 5,135,607 | 8/1992 | Hirai | 156/643 |
| 5,294,285 | 3/1994 | Kanai et al. | 156/610 |
| 5,344,792 | 9/1994 | Sandhu et al. | 437/200 |

OTHER PUBLICATIONS

"Si Doped GaAs Using a SiCl$_4$ Technique in a AsCl$_3$/Ga/H$_2$ CVD System for MESFET", M Fen, V Eu, T Zielinski, and HB Kim, Inst. Phys. Conf. Ser. No. 56; Chapter 1.

"Preparation of amorphous silicon films by chemical vapor deposition from higher silanes Si$_n$N$_{2n+2}$(n>1)", S. C. Gau, B. R. Weinberger, M. Akhtar, Z. Kiss, and A. G. MacDiarmid, Appl. Phys. Lett. 39(5), Sep. 1, 1981.

"Metalorganic Molecular–Beam Epitaxial Growth and Characterization of GaAs Using Trimethyl—and Triethyl–Gallium Sources", E. Tokumitsu, Y. Kudou, M. Konagai, and K. Takahashi; Japanese Journal of Appl. Phys., vol. 24, No. 9, 1985, 1189–1192.

"Doping of GaAs in Metalorganic MBE using Gaseous Sources"; H. Heinecke, K. Werner, M. Weyers, H. Lüth and P. Balk, Journal of Crystal Growth 81 (1987) 270–275.

"Silicon Doping from Disilane in Gas Source MBE of GaAs", K. Kimura, S. Horiguchi, K. Kamon, M. Shimazu, M. Mashita, M. Mihara and M. Ishii; Journal of Crystal Growth 81(1987) 276–280.

"Heavy carbon doping of metalorganic chemical vapor deposition grown GaAs using carbon tetrachloride", B. T. Cunningham, M. A. Haase, M. J. McCollum, J. E. Baker, and G. E. Sullivan, Appl. Phys. Lett. 54(19), May 1989.

"Anomalous Silicon and Tin Doping Behavior in Indium Phosphide Grown by Chemical Beam Epitaxy", P. J. Skevington, D. A. Andrews and G. J. Davies, Journal of Crystal Growth 105 (1990) 371–374.

"All-gaseous doping during chemical-beam epitaxial growth of InGaAs/InGaAsP multiquantum-well lasers", W. T. Tsang, F. S. Choa, R. A. Logban, T. Tanbun–Ek, and A. M. Sergent, Appl. Phys. Lett. 59(9), Aug. 1991.

(List continued on next page.)

*Primary Examiner*—Robert Kunemund
*Attorney, Agent, or Firm*—Greer, Burns & Crain, Ltd.

[57] ABSTRACT

An process for efficient controlled N-type silicon doping of Group III–V materials. Through the present invention silicon may be introduced into Group III–V materials at incorporation efficiencies in excess of $10^{-4}$. In a preferred embodiment doping with silicon tetrabromide attains incorporation efficiencies of approximately 0.37. Silicon incorporation efficiencies of approximately 1 should be obtained using silicon tetraiodide. The silicon dopant sources of the present invention may be used to accurately selectively produce net electron concentrations varying from approximately $1\times10^{16}$ to $1.2\times10^{20}$ cm$^{-3}$. Favorable room temperature vapor pressures of the dopants used in accordance with the present invention allow for production of abrupt doping profiles. Additionally, high photoluminescence peak values, and low contact and sheet resistances are obtained through the present invention. The efficient controlled doping of the present invention is 10,000 times more efficient than known silicon tetrachloride dopant techniques and may be used to produce many semiconductor devices.

16 Claims, 6 Drawing Sheets

OTHER PUBLICATIONS

"Generation of fast-switching $As_2$ and $P_2$ beams from $AsH_3$ for gas-source molecular beam epitaxial growth of InGaAs/InP multiple quantum well and superlattice structures", S. L. Jackson, J. N. Bailargeon, Al. P. Curtis, X. Liu, J. E. Baker, J. I. Malin, K. C. Hsieh, S. G. Bishop, K. Y. Cheng, and G. E. Stillman, J. Vac. Sci. Technol. B 11(3), May/Jun 1993.

Fresina et al, "InP/InGaAs HBTs with Nt-InP Contacting Layers Grown by MOMBE Using $SiBr_4$", Electronic Letters (1994) vol. 30(25) pp. 2177–2178.

Jackson et al, "High-Efficiency Silicon Doping of InP, GaAs in Gas Source . . . ", Applied Physics Letters vol. 64(21) May 23, 1994, pp. 2867–2869.

Weyers et al, "Gaseous Dopant Sources In MOMBE/CBE", Journal of Crystal Growth, vol. 105(1990) pp. 383–392.

PROCESS FOR FORMING SILICON DOPED GROUP III-V SEMICONDUCTORS WITH SIBR$_4$

The present invention relates generally to a high efficiency process for silicon doping of group III-V semiconductors such as the indium gallium arsenide phosphide alloy system including its binary and ternary constituents. More specifically, the present invention relates to a highly efficient process for controlled growth of N-type material using epitaxial growth techniques such as molecular beam epitaxy (MBE), gas-source molecular beam epitaxy (GSMBE), chemical beam epitaxy (CBE), metalorganic molecular beam epitaxy (MOMBE) and metal organic chemical vapor deposition (MOCVD) and using silicon tetrabromide or silicon tetraiodide as a dopant. Doping in accordance with the present invention may be used to efficiently produce low resitivities which are important for high speed semiconductor device implementations.

BACKGROUND OF THE INVENTION

Semiconductor integrated circuits are the fundamental building block of modern electronic devices. Computers, cellular phones, and consumer electronics rely extensively on these devices which may be used for storage of, computations on, and communication of data.

The most common semiconductor devices are formed using silicon and silicon compounds. Layers and regions of N-type material (such as silicon), P-type material, and insulative material are combined to form electronic devices and circuits. N-type material is material which includes an excess of electrons. A typical method of producing N-type material is the introduction of certain atomic impurities into the semiconductor during growth of the semiconductor. When certain other atomic impurities are introduced during growth, the resulting material will generally be P-type, having "holes", or in other words, a deficit of electrons. In a P-type material, the holes act as charge carriers for flow of electricity. In an N-type material, the excess electrons act as charge carriers. An insulator material is one which has a high resistance to current flow and may be used to isolate discrete components of a circuit, and act as a substrate on which active devices may be grown.

The arrangement of P-type, N-type, and insulative materials and the respective electrical connections to each will determine what type of electrical device is created. Transistors, diodes, capacitors and most other electrical devices are created through the arrangement of these materials in a semiconductor device.

Recently, the advantages of using the Group III-V semiconductors as the primary device building block (semiconductors formed from compound alloys including Group III and Group V elements) has led to extensive research and development. Among the typically used compounds and alloys are indium gallium arsenide (InGaAs), gallium phosphide (GAP), gallium arsenide (GaAs), aluminum gallium arsenide (AlGaAs), indium gallium phosphide (InGaP), indium gallium aluminum phosphide, and indium phosphide (InP). The basic designs for the transistors and other devices used in silicon-based electronic devices have been adapted to Group III-V materials. Devices made from the Group III-V materials generally require lower power and are faster (operate at higher frequencies).

Group III-V semiconductor materials may also be used to produce opto-electronic semiconductor lasers. In such devices an active region of un-doped or low-doped semiconductor material that is sandwiched between dual layers of P-type and N-type doped materials emits coherent light in response to the application of electrical current. The light is produced when holes from the p-type material recombine with electrons from the n-type material in the active region.

Other applications of the Group III-V materials are known to those in the art and include optical detectors, high-speed amplifiers and logic circuits. However, the widespread substitution of these semiconductors for silicon devices is impeded by the relative difficulty and expense in producing a group III-V conductor in comparison to the silicon devices.

One of the problems encountered in the production of these materials relates to the production of N-type group III-V layers. Silicon is widely recognized as the principle dopant vehicle by which N-type group III-V layers are grown. However, typical manners of supplying silicon as a dopant source are inefficient and may produce undesirable side effects.

One example of an undesirable side effect arises from the known technique of using elemental silicon as a dopant. The method is incompatible with the MOMBE growth technique. In this technique, a substrate is placed into a chamber and a silicon block is heated to a given temperature to produce the beam of elemental silicon atoms. This results in the formation of a passivating crust of carbon and SiC on the hot Si surface. This crust greatly reduces doping efficiency since the effective area from which the silicon may be released is reduced.

Other silicon dopant sources may also lead to practical difficulties. Vapor sources of silicon such as $SiH_4$ and $Si_2H_6$ have been investigated as potential dopants for Group III-V materials such as InP and GaAs. The use of $SiH_4$ to dope GaAs may be inefficient since precracking of the Si—H bonds is required. Precracking is a process by which the $SiH_4$ is heated to a very high temperature, on the order of 1200° C., in a tube or other space prior to introduction into the reactor chamber including the Group III-V Ga and As precursors. The precracking is necessary because the typical pressures and temperatures used to cause reaction between the Ga and As precursors are too low to crack the Si—H bonds.

Precracking of the $SiH_4$ is also required to dope other Group III-V materials such as InP and InGaAs. Those materials are typically grown at temperatures even lower than GaAs and precracking is necessary. The additional step of precracking and the high temperatures required to make the $SiH_4$ silicon dopant process work render the growth process inefficient.

The Si—H bond strengths render use of $SiH_4$ inefficient, but Si—H bonds are more easily broken in $Si_2H_6$. The weaker bonds suggest that cracking should occur more efficiently at the growth temperatures used during group III-V growth techniques. Nonetheless, previous $Si_2H_6$ doping of InP has shown only moderate success. Experiments using $Si_2H_6$ to dope InP during beam epitaxy growth techniques have obtained a relatively low maximum doping concentration of $1.4 \times 10^{18}$ cm$^{-3}$. This low concentration limits the ability of $Si_2H_6$ to produce highly N-type layers that are useful in many semiconductor devices.

Tin doping has also been investigated as an alternative method to silicon doping for producing N-type group III-V materials. Tin precursors such as $Sn(C_2H_5)_4$ incorporate at fairly high efficiencies into Group III-V layers. Additionally, the elemental Sn does not form a carbide and problems associated with formation of a crust on the Sn precursor is not a concern. However, other problems arise from the use of Sn as a dopant. Unlike silicon, tin has a tendency to remain reactive during growth of subsequent regions. Thus, after growth of a Sn doped N-type region, subsequently grown regions may be unintentionally doped with Sn. Such unintentional doping impedes efforts at controlling the composition of discrete semi-conductor device regions. That control is essential to the production of useful devices.

The Sn dopant sources also exhibit what is known as a memory effect in the growth reactor system used to grow the Group III–V semiconductor material. Relatively high pressure is necessary to induce the vapor state of the Sn precursor. This relatively high pressure renders the abrupt shut-off of the dopant source difficult and sharp doping profiles are therefore not easily obtained. The effect of a gradual shut off of the dopant source results in what is commonly termed the memory effect in the reactor.

In sum, there is a need for a more efficient method for the controlled silicon doping of group III–V materials to produce N-type regions. It is therefore an object of the invention to provide an improved process for silicon doping of Group III–V materials to produce N-type semiconductor regions, including InP regions.

Another object of the invention is to provide an efficient silicon doping process for selectively producing net electron concentrations in the approximate range of $1\times10^{16}$ to $1.2\times10^{20}$ cm$^{-3}$ in Group III–V semiconductor regions, including InP regions.

Yet another object of the invention is to provide a process for silicon doping of Group III–V semiconductor material in which a silicon dopant precursor incorporates silicon into the semiconductor at an efficiency in excess of approximately $10^{-4}$.

A further object of the invention is to provide a process for silicon doping of Group III–V semiconductor material in which a silicon dopant precursor supplies silicon which activates electrically in the semiconductor material at a rate approaching 100%.

A still further object of the invention is to provide a process for silicon doping of Group III–V semiconductor material including InP which produces semiconductor regions allowing contact resistances lower than approximately $10^{-7}$ ohm-cm$^2$.

An additional object of the invention is to provide a process for silicon doping of Group III–V semiconductor material using a silicon dopant precursor of silicon tetrabromide or silicon tetriodide.

SUMMARY OF THE INVENTION

In keeping with an aspect of the present invention, an efficient process for growing N-type Group III–V semiconductor regions is disclosed. In the preferred embodiment, a silicon dopant precursor is introduced into a growth reactor chamber along with Group III–V precursors after a substrate in the reactor chamber has been heated. As the Group III–V componds react to form an epilayer region, silicon is donated by the silicon dopant precursor and incorporated into the epilayer at efficiencies in excess of $10^{-4}$. The silicon electrically activates in the epilayer at a rate of nearly 100%. Additionally, net electron concentrations may be selectively produced in the epilayer within the approximate range of $1\times10^{16}$ to $1.2\times10^{20}$ cm$^{-3}$. Preferably, the silicon dopant precursor is silicon tetrabromide, but use of silicon tetraiodide is also contemplated within the scope of the present invention.

Regions grown in accordance with the present invention may be efficiently incorporated into many known semiconductor device structures including, but not limited to, transistors, diodes and semiconductor layers. Regions grown in accordance with the present invention may be produced to exhibit low contact resistances and sheet resistances that are conducive to use as high-speed device contact layers, for instance, as emitter and collector contact layers in heterojunction bipolar transistors. The silicon tetrabromide molecule utilized as a dopant in accordance with the preferred embodiment has a favorable room temperature vapor pressure making the practical use of the dopant efficient.

BRIEF DESCRIPTION OF THE DRAWINGS

Other objects, features and advantages of the present invention will be apparent to those skilled in the art with reference to the following detailed description and drawings, of which.

DETAILED DESCRIPTION OF THE INVENTION

The principles of the present invention will be illustrated, in part, by reference to particular examples of regions grown in accordance with the invention. The illustrative examples utilize GSMBE and MOMBE growth techniques to dope InP and In$_{0.53}$Ga$_{0.47}$As, but those in the art will appreciate that any of the beam epitaxy techniques may be used. Similarly, although the examples utilize indium phosphide and indium gallium arsenide as the Group III–V materials, the silicon doping of the present invention is equally applicable to any of the group III–V compounds utilized to produce semiconductor devices.

Each of the example epilayer regions were grown in a Perkin Elmer (PHI) model MBE reactor system, but any suitable reactor may be used. The Perkin system was equipped with a 2200 liter per second turbomolecular pump and a 5000 liter per second cryopump. The precursors for the InGaAs layers were TMIn, TEGa, and AsH$_3$. The TMIN and TEGa were injected without carrier gas, through a pyrolyric boron nitride-based injector using a pressure-based flow controller downstream of the bubbler, while the AsH$_3$ flow rate was controlled between approximately 3 and 5 standard cubic centimeters per minute (sccm) resulting in a growth rate of approximately 2.3 µ/h. SiBr$_4$ dopant delivery may be delivered in the same manner as used for the Group III metalorganics, by dilution in H$_2$ with controlled monitoring of the H$_2$ flowrate, or any other equivalent manner. Precursors for the InP layers were TMIn (In(CH$_3$)$_3$) and pure PH$_3$. PH$_3$ flow rates between 2.5 and 4 sccm resulted in an approximate growth rate of 1.25 µ/h.

Substrate growth temperatures of between 325° and 500° C. were used in growth of all of the exemplary epilayer regions. The substrates were formed of iron doped InP.

Each of the samples grown utilized SiBr$_4$ as the silicon precursor dopant source. However, based upon bond strength, incorporation efficiency trends, and halide molecule similarities SiI$_4$ should also act as an efficient silicon precursor dopant source. For this reason, the use of SiI$_4$ is also contemplated as within the scope of the present invention.

Figure 1:
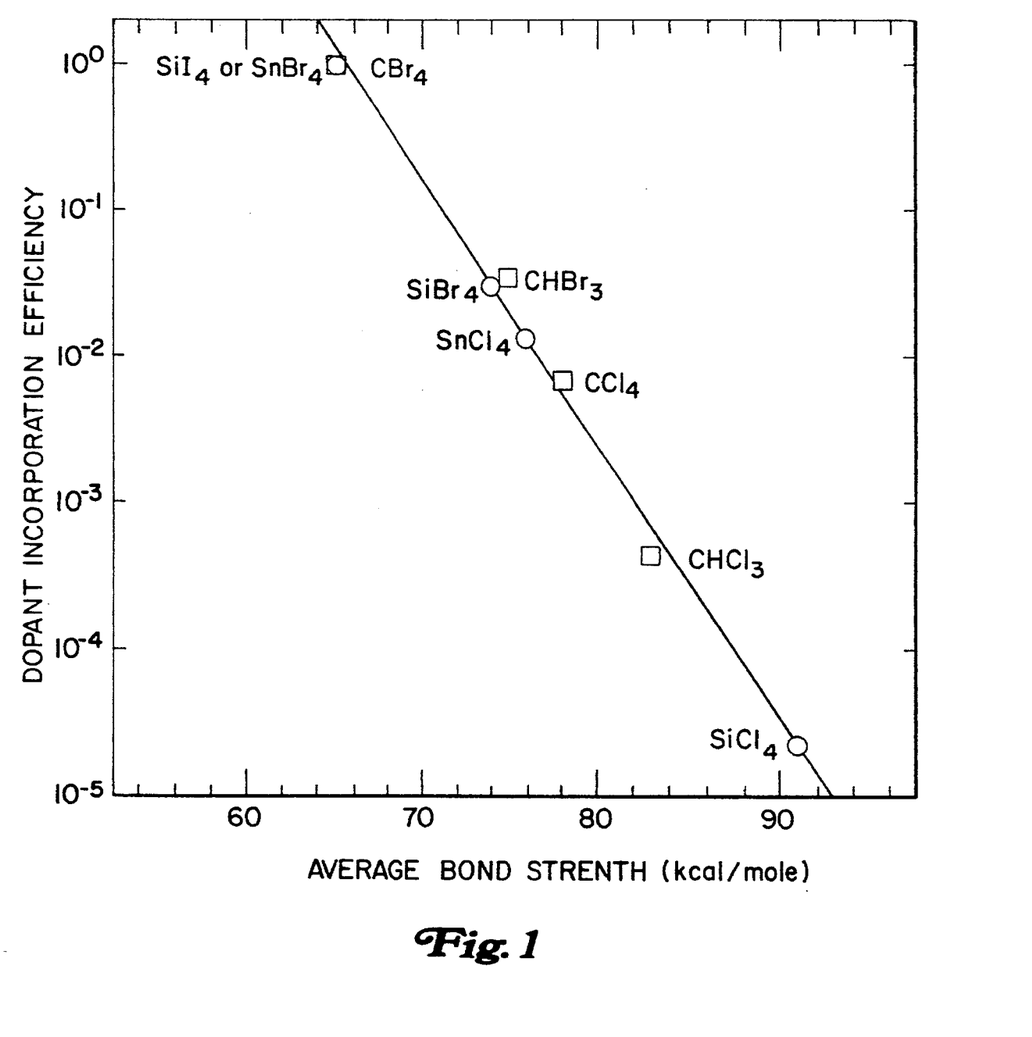
FIG. 1 is a plot of dopant incorporation efficiency versus average bond strength illustrating the high efficiency of silicon dopant incorporation using silicon tetrabromide or silicon tetraiodide in accordance with the present invention.

Referring now to FIG. 1, shown is a plot of dopant incorporation efficiency versus average bond strength for various compounds. The incorporation efficiency E$_i$ is calculated according to the following expression:

$$E_i = \frac{\{\text{dopant concentration}\} \times \{\text{Group III precursor flow}\}}{\{\text{Group III concentration}\} \times \{\text{dopant precursor flow}\}}$$

In essence, the efficiency measures the rate at which dopant is incorporated into the semiconductor versus the dopant precursor flowrate. The details concerning incorporation efficiency calculation are set for in articles by Ando et al. and Weyers et al., *J. Crystal Growth* 115, 464 (1991), *J. Crystal Growth* 105, 383 (1990), which are incorporated herein by reference. Applying the efficiency expression to an indium gallium arsenide epilayer doped with silicon tetrabromide in accordance with the present invention yields an efficiency incorporation measurement of 0.37 as follows:

$$E_i = \frac{(4 \times 10^{19} \text{ cm}^{-3})(1.5 \text{ sccm})}{(2 \times 10^{22} \text{ cm}^{-3})(3 \text{ sccm})(.0027)}$$

where the Si concentration is $4 \times 10^{19}$, the In concentration is $2 \times 10^{22}$, the flowrate of TMIn is 1.5 sccm and the flowrate of the SiBr$_4$ is (3×.0027) sccm taking into account a dilution ratio of H$_2$:SiBr$_4$ of 375:1.

As is readily apparent from FIG. 1, the incorporation efficiency of SiBr$_4$ is nearly ten thousand times greater than the incorporation efficiency of SiCl$_4$. Other data points are plotted for CCl$_4$, CHBr$_3$, CHCl$_3$, SnBr$_4$, CBr$_4$ and SnCl$_4$ to demonstrate the inverse proportionality of bond strength and incorporation efficiency showing that SiI$_4$ will incorporate at an efficiency approaching 1. The data point for SiI$_4$ is a predicted value based upon the trend apparent from the other measured data points.

The carbon compounds in the plot of FIG. 1 show that incorporation efficiency is inversely proportional to the average bond strength of the compound. As demonstrated by the present work using SiBr$_4$ as a dopant, the same proportionality holds true for the silicon and tin tetrahalides SiCl$_4$, SnCl$_4$ and SiBr$_4$. For N-type doping in accordance with the present invention, the SiBr$_4$ dopant is preferred since it is much more efficient than the known dopant SiCl$_4$, and does not exhibit the side effects associated with the tin compounds.

Additionally, the use of SiI$_4$ as a dopant should yield incorporation efficiencies even higher than the SiBr$_4$ while providing all of the advantages of the SiBr$_4$. As is apparent from the plot of FIG. 1, incorporation efficiency is dependent, at least in part, on the bond strength of the molecule. Molecules with lower bond strengths disassociate more easily and have higher incorporation efficiencies. The bonds in the SiI$_4$ molecule average approximately 68 kcal/mole, whereas the bond strengths of the SiBr$_4$ and SiCl$_4$ are approximately 74 kcal/mole and 91 kcal/mole, respectively. Applying the trend exhibited by all of the data points including the carbon compounds, and considering the similar nature of the silicon tetrahalides (SiI$_4$, SiBr$_4$ and SiCl$_4$), gives a reliable prediction of the good incorporation efficiency for the SiI$_4$.

In epitaxial device growth applications, the SiBr$_4$ and SiI$_4$ doping in accordance with the present invention provides distinct advantages over the known SiCl$_4$ dopant. In addition to the higher incorporation efficiency, the dopants used in accordance with the present invention have much lower vapor pressure at any given temperature compared to SiCl$_4$. Lower vapor pressure allows for a more abrupt shut off of the dopant source. This ability to abruptly shut off the dopant source provides sufficient control to create sharp doping profiles which are desirable in many semiconductor device.

Figure 2:
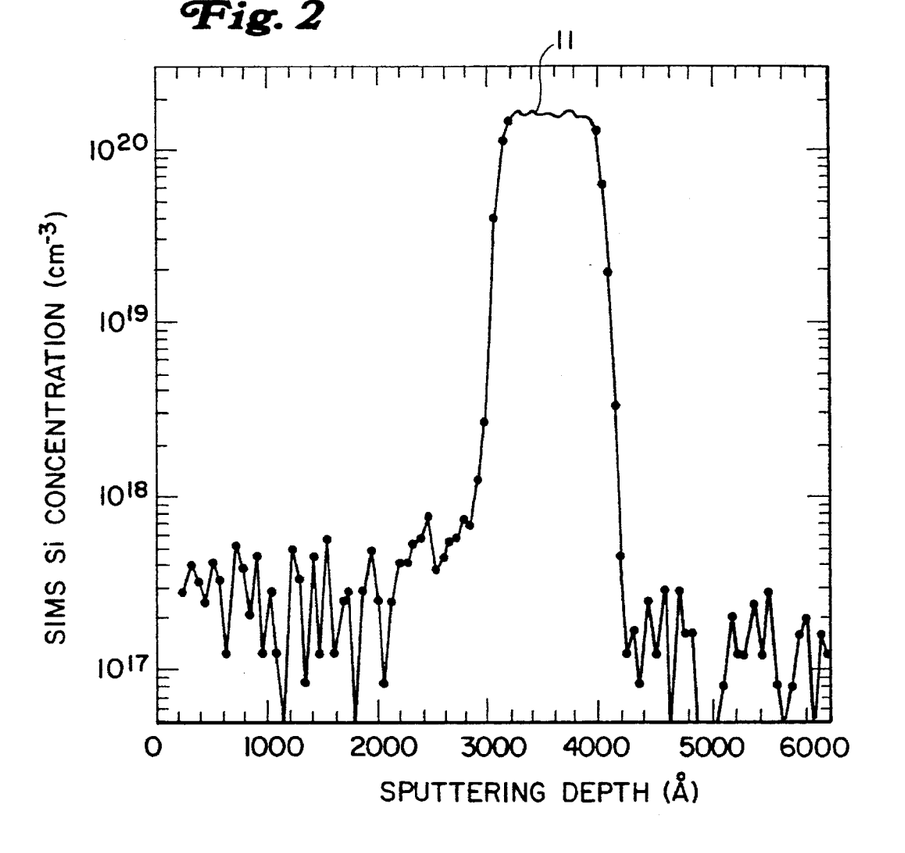
FIG. 2 is a plot of silicon concentration versus sputtering depth for a multilayer structure grown including a layer doped with silicon tetrabromide in accordance with the present invention.
Figure 3:
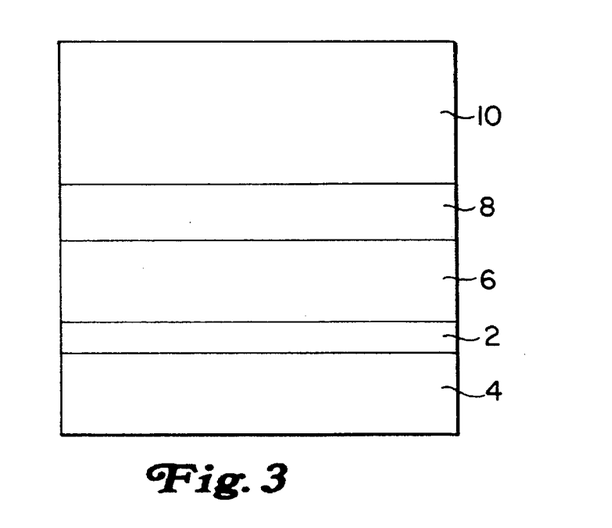
FIG. 3 shows the structure from which the FIG. 2 plot was obtained.

Abrupt control over doping profiles obtainable with the present invention is well illustrated in FIG. 2, which plots Si concentration versus sputtering depth for an InP sample grown by GSMBE using a SiBr$_4$ dopant in accordance with the present invention. The concentrations were from the GSMBE sample 1 grown in accordance with the present invention and illustrated in FIG. 3. A 100 Å thick In$_{0.53}$Ga$_{0.47}$As stop layer 2 was grown on an iron doped InP substrate 4, followed by a 2000 Å undoped InP layer 6, a 1000 Å layer 8 of InP doped through use of SiBr$_4$ in accordance with the present invention, and a 3000 Å undoped InP cap layer 10.

In FIG. 2, the doping concentration in the layer 8 is indicated by the flat peak 11, and the profile on either side of the peak indicates the good abrupt profile realized according to the present invention. Undoped layer 6, measured to the right of peak 11, exhibits some background Si concentration arising from contamination or the lower limit of the sensitivity of the SIMS (secondary ion mass spectrometry) technique used to measure the Si concentration. The undoped layer 10 exhibits higher background Si concentration than the layer 6, as indicated to the left of the peak 11.

The higher background concentration of approximately $3 \times 10^{17}$ cm$^{-3}$ in the layer is attributable to a memory effect in the reactor. While the SiBr$_4$ memory effect is less severe than that exhibited with use of SICl$_4$, use of SiI$_4$ as dopant should eliminate the effect. As discussed above, the lower vapor pressure of the SiI$_4$ will allow for an even more abrupt shut-off of the dopant source than when SiBr$_4$ is used.

Figure 4:
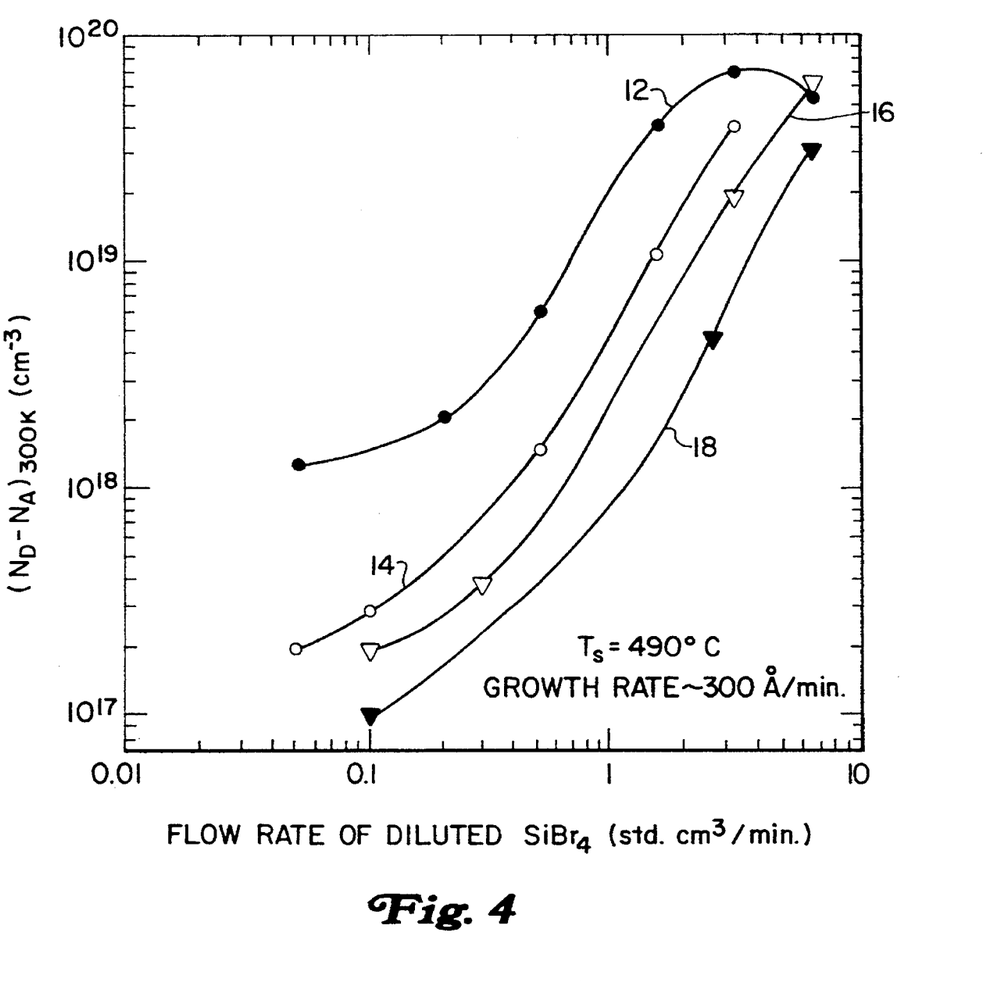
FIG. 4 is a plot of net electron concentration versus silicon tetrabromide dopant flowrate for indium phosphide and indium gallium arsenide regions grown by GSMBE and MOMBE in accordance with the present invention.

Referring now to FIG. 4, shown is a plot of net electron concentration versus SiBr$_4$ dopant flowrate. The curves 12 and 14 track net electron concentration for SiBr$_4$ doped InP grown by GSMBE and MOMBE, respectively, while curves 16 and 18 represent concentrations for In$_{0.53}$Ga$_{0.47}$As respectively grown by the same techniques. Substrate temperature was maintained at approximately 490° C. for growth tracked by each of the curves, and growth rate remained static at approximately 300 Å/minute. That growth rate remained constant was checked by growing InP layers at varying flowrates. With variation of temperature between 490° and 510° C., even at the highest flowrates of SiBr$_4$ growth rate for doped layer remained measurably unchanged as compared to undoped layers.

The good controlled doping obtained in accordance with the present invention is clear from FIG. 4. Through variance of the SiBr$_4$, flow rate, predictable controlled doping over the range of approximately $2 \times 10^{17}$ to $6.8 \times 10^{19}$ cm$^{-3}$ was obtained for temperatures around 500° C. Such control is important for various semiconductor device applications, an example of which is the In0.53Ga$_{0.47}$As/InP heterojunction bipolar transistor. Analogous results should be obtained using SiI$_4$. Lower concentrations down to $1 \times 10^{16}$ cm$^{-3}$ could likely be obtained by adopting an ultra high vacuum leak valve flow control scheme for dopant delivery into the reactor. Higher concentrations may be obtained with other growth temperatures. The good net electron concentrations obtained for modest flowrates confirms the high Si incorporation efficiency obtained using SiBr$_4$ in accordance with the present invention.

While excellent doping control was realized with flowrate variation, flowrate did have an effect on In0.53Ga0.47As alloy composition. For a MOMBE sample doped to $3 \times 10^{19}$ cm$^{-3}$, a approximate shift of 600 arcsecond, indicating Ga excess incorporation, was observed through high resolution double crystal x-ray diffractometry in the epitaxial layer peak as compared to low or moderately doped In0.53Ga0.47As layers. The effect is compensated for by a slight decrease in the TEGa precursor flow rate. Thus, increased efficiency need not alter alloy composition.

Figure 5:
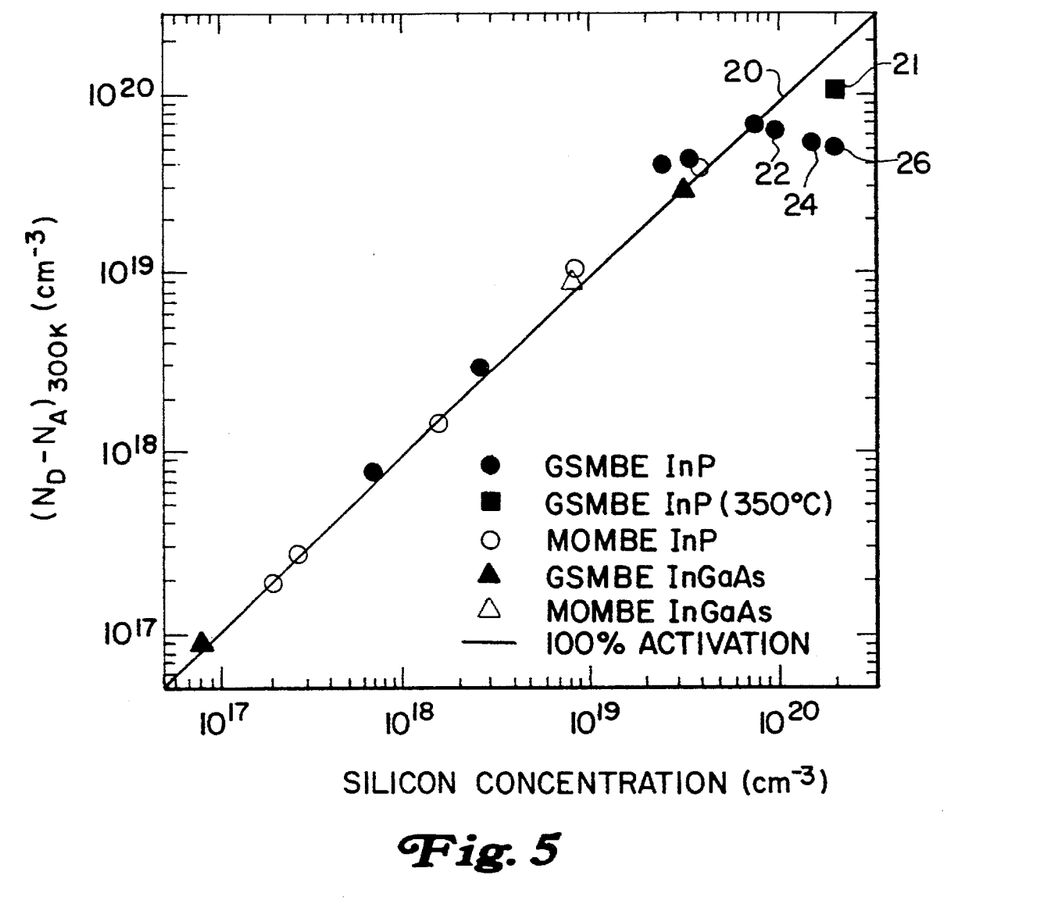
FIG. 5 is a plot of net electron concentration versus silicon concentration for indium phosphide and indium gallium arsenide regions grown by GSMBE and MOMBE in accordance with the present invention.

Further evidence of the good efficiency of the doping techniques of the present invention is apparent in FIG. 5, which shows a plot of net electron concentrations versus silicon concentration for InP and InGaAs samples grown according to the present invention. Data points track electron concentration for GSMBE and MOMBE InP and InGaAs samples grown at substrate temperature in the range of 490°–500° C., as well as a GSMBE InP sample grown at a substrate temperature of 350° C.

A line 20 tracks 100% electrical activation of silicon in the samples. In other words, the line 20 represents a donation of one electron for each Si atom incorporated into the Group III–V region which is grown. Samples exhibited good surface morphology. For Si concentrations of $6.8 \times 10^{19}$ cm$^{-3}$ or less in the InP samples, approximately 100% electrical activation of the Si was obtained. After that concentration is exceeded a saturation tendency is exhibited by the data points 22, 24 and 26. This tendency also appears in the upper portion of the curve 12 of FIG. 4, and suggests that $6.8 \times 10^{19}$ cm$^{-3}$ may represent a limit for active Si donor concentration for growth at 490°–500° C. However, point 21 indicates that a higher doping concentration may be obtained at lower temperature, the point 21 represents an approximate concentration of $1.2 \times 10^{20}$ cm$^{-3}$.

Figure 6:
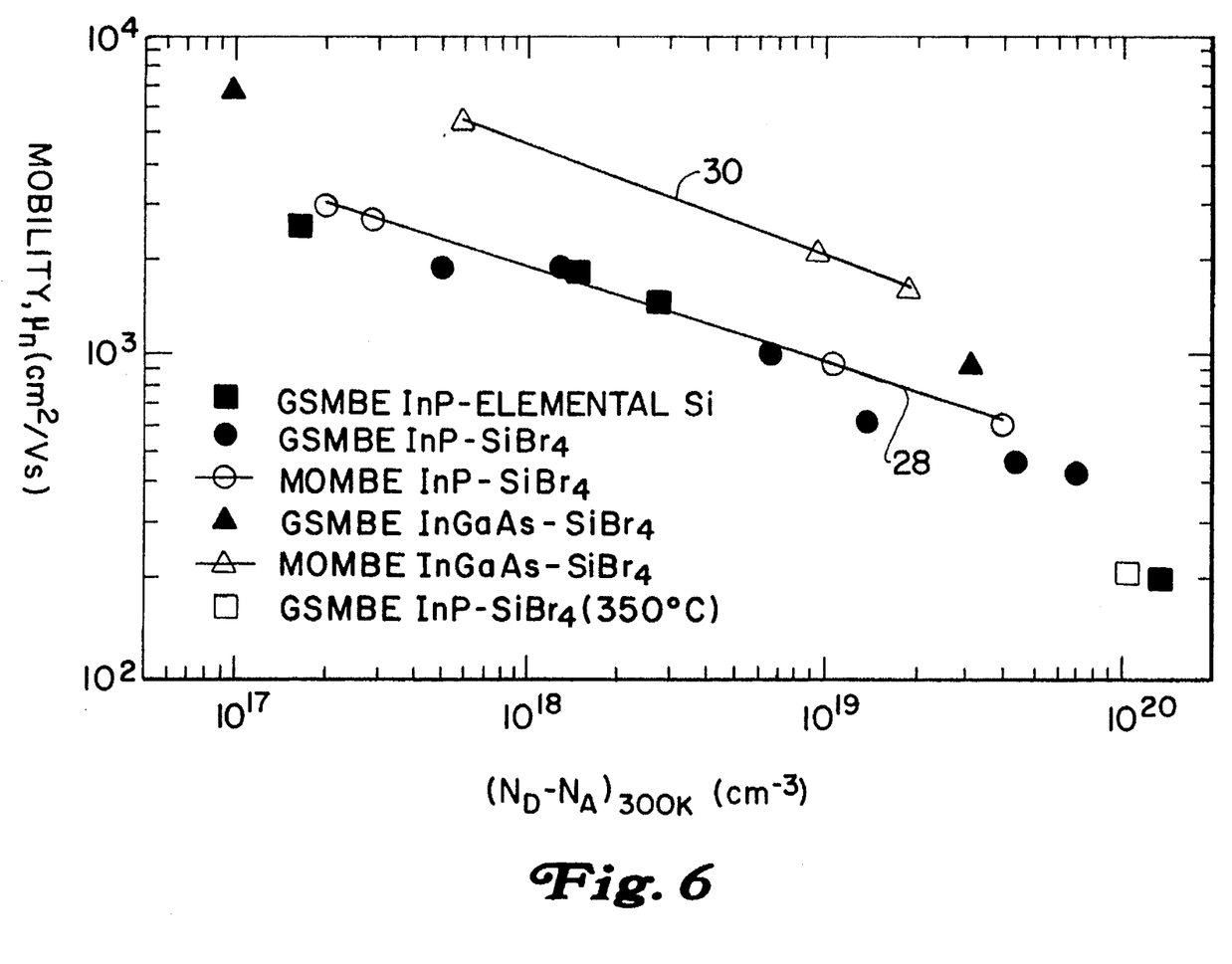
FIG. 6 is a plot of majority carrier mobilities versus net electron concentration for indium phosphide and indium gallium arsenide regions grown by GSMBE and MOMBE in accordance with the present invention compared to conventional Si effusion cell doping.

FIG. 6 plots room temperature (300 K) majority carrier mobilities for InP and InGaAs samples grown by GSMBE and MOMBE in accordance with the present invention, as well as an InP sample grown according to conventional elemental Si doping techniques. Carrier mobilities remain good across a range of electron concentrations, while exhibiting the inherent decrease in mobility as the material becomes more N-type with increasing electron concentration. As shown by the line 28, the mobilities for most samples grown using the silicon tetrabromide doping of the present invention are comparable to those obtained by elemental Si doping. Additionally, the MOMBE InGaAs samples grown according to the present invention exhibited exceptional mobilities exceeding the elemental Si doped sample mobilities over a range of net electron concentrations. The good mobilities demonstrate that regions grown in accordance with the present invention are suitable for high speed device applications.

Resistance for the samples were also good as shown by transmission line measurements which were made on two heavily doped InP samples having respective net electron concentrations of $6.3 \times 10^{19}$ cm$^{-3}$ and $5.2 \times 10^{19}$ cm$^{-3}$. These measurements are conducted by placing metal pads at various intervals on the layer and measuring the current flow between the pads. The measurements revealed InP sheet resistances below 10 ohm/square, which are 33% below minimum values obtained through Si ion implantation of InP.

Contact resistance was also measured using a non-alloyed Ti/Pt/Au contact. For InP layers doped to $6.3 \times 10^{19}$ contact resistances as low as $3 \times 10^{-8}$ ohm-cm$^2$ were obtained. This value is lower than previously obtained InP values and is lower than typically obtained InGaAs contact resistances for layers doped to $3 \times 10^{19}$. Taken together, the good contact and sheet resistances produced according to the present invention may be advantageously adapted to high-speed device structure contact layers. As an example, ultraheavily Si-doped InP grown in accordance with the present invention would be useful as emitter and collector contact layers in heterjunction bipolar transistors.

Unlike heavily doped samples using standard techniques of elemental Si doping, the heavily doped regions grown in accordance with the present invention exhibit good surface morphology. Heavily doped InP layers having net electron concentrations exceeding approximately $3 \times 10^{19}$ exhibited poor morphologies when grown on substrates between 375° C. and 435° C. Morphology for samples grown above and below those temperatures were good. Thus, regions doped beyond $1 \times 10^{19}$ cm$^{-3}$ and approaching $10^{20}$ may be produced in accordance with the present invention without severe adverse effect in the crystallinity of the layer.

Figure 7:
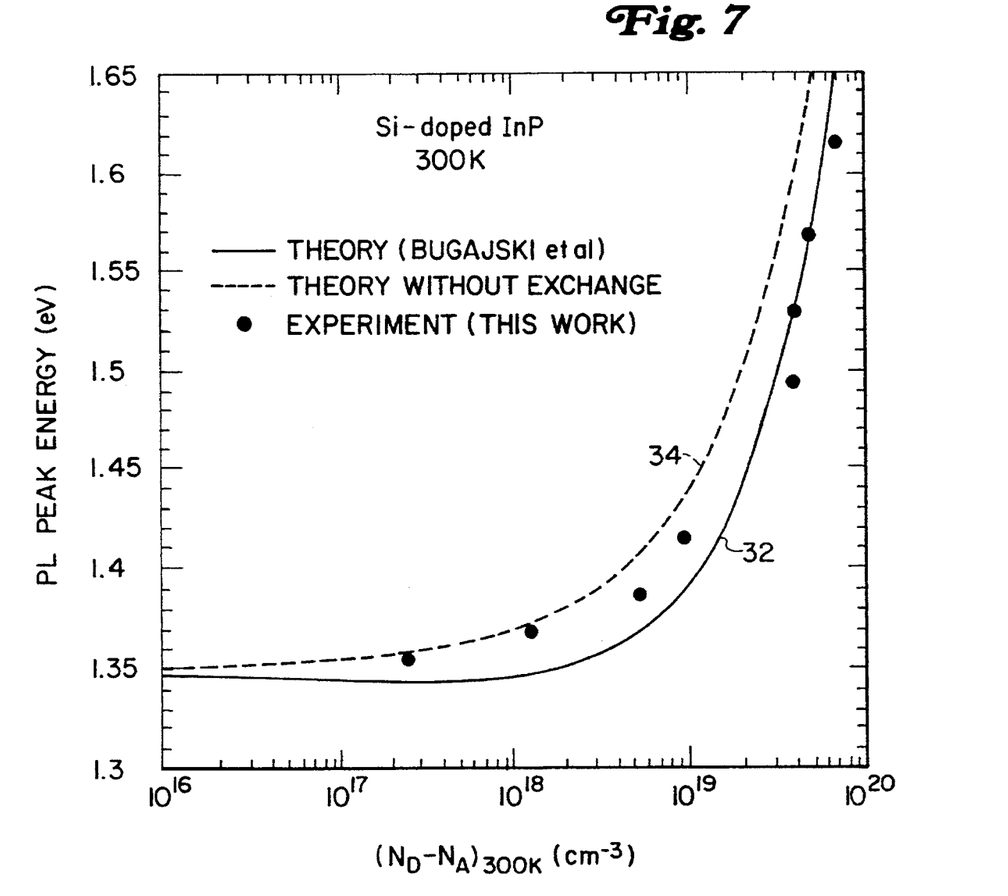
FIG. 7 is a plot of theoretical peak photoluminsence and measured peak photoluminsence obtained in an indium phosphide sample grown according to the present invention versus net electron concentration.

Optical device applications such as semiconductor lasers will benefit from the good texture heavily doped layers since good photoluminescence values may be obtained at the high doping values. Theoretical peak room temperature (300 K) photoluminescence energies with increasing net electron concentrations have been calculated by Bugajski, J. Appl. Phys. 57, 521 (1985), and Morishita, J. Crystal Growth 104, 457 (1990), both of which are incorporated herein by reference, and the theoretical energies are tracked by curves 32 and 34, with and without contribution from exchange interaction between free carriers, respectively. Data points for InP doped according to the present invention closely track the theoretical predictions and confirm that the highly doped regions exhibit good photoluminescence. For concentrations greater than $1 \times 10^{18}$ cm$^{-3}$ a rapid increase in peak photoluminescence energy is realized with increasing net electron concentration. At these higher doping concentrations a shift in peak photoluminescence energy of 265 meV is realized as compared to nominally indoped InP. The good photolumisence energies obtained with good surface morphologies make layers grown according to the present invention useful for semiconductor optical device applications.

Figure 8:
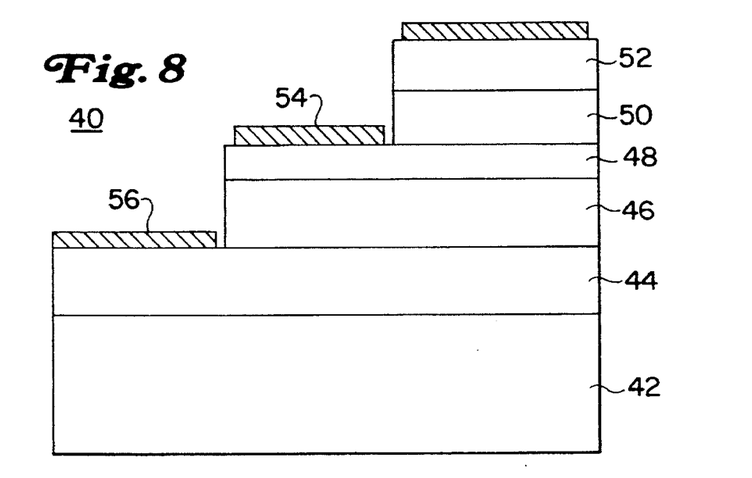
FIG. 8 shows a heterojunction bipolar transistor grown in accordance with the present invention.

Other known device structures will also benefit from the efficient controlled doping provided by the present invention. A typical heterojunction bipolar transistor 40 grown in accordance with the present invention is shown in FIG. 8. The transistor 40 has a substrate 42, of iron doped InP, for instance. A sub-collector layer 44, may be SiBr$_4$ doped InP.

This layer 44 is heavily doped to approximately $5\times10^{19}$ cm$^{-3}$. A collector layer 46 is lightly doped using SiBr$_4$ to approximately $1\times10^{16}$ in accordance with the present invention, and may be formed of InGaAs or InP, for example. A p-type base layer 48 may be formed of InGaAs doped using carbon, beryllium or another p-type dopant to approximately $1\times10^{16}$ cm$^{-3}$. An emitter layer 50 is formed of SiBr$_4$ doped InP, to a concentration of between $5\times10^{17}$ to $1\times10^{18}$. Finally, an emitter contact layer of heavily silicon doped InP, to approximately $6\times10^{19}$ to $10^{12}$ cm$^{-3}$ is formed according to the present invention and provides very low contact resistance. Base and collector metallic contacts 54 and 56 are formed after a selective etching is carried out down to the base 46 and collector layers. Since the present invention allows for use of InP as the emmitter contact layer 52, with sufficiently low resistances, the layers beginning with the emitter contact layer 52 alternate downward between InGaAs and InP. InP emitter contact layers are formed with resistances lower than previously obtained with InP contacts. Thus, a selective etching process may be used to form the contacts 54 and 56 as the emitter contact and subsequent layers each use alternating InGaAs and InP layers. This provides a manufacturing advantage over the precisely timed etching techniques necessary when and InGaAs emitter contact layer is used and the layers do not alternate.

While a particular embodiment of the present invention has been described, it will be appreciated by those skilled in the art that changes and modifications may be made thereto without departing from the invention in its broader aspects and as set forth in the following claims. Layers grown in accordance with the present invention are readily applicable to many well known semiconductor devices.

What is claimed is:

1. A method for growing N-type group III–V semiconductor material comprising the steps of:

heating a substrate in a growth reactor chamber;

supplying group III–V precursors to said growth reactor chamber; and supplying a silicon dopant precursor to said growth reactor chamber, said silicon dopant precursor selectively producing epitaxial layer net electron concentrations in the approximate range of $1\times10^{16}$ to $1.2\times10^{20}$ cm$^{-3}$, wherein said silicon dopant precursor supplies elemental silicon at an incorporation efficiency in excess of approximately $10^{-4}$.

2. A method for growing N-type group III–V semiconductor material according to claim 1 wherein said silicon dopant precursor supplies silicon which electrically activates at a rate of nearly 100%.

3. A method for growing N-type group III–V semiconductor material according to claim 1 where said silicon dopant precursor is silicon tetrabromide.

4. A method for growing N-type group III–V semiconductor material according to claim 1 wherein said silicon dopant precursor is silicon tetraiodide.

5. A method for growing N-type group III–V semiconductor material according to claim 3 further comprising the steps of:

continuing said supplying of said group III–V precursors and said silicone tetrabromide until an epitaxial layer of predetermined thickness is grown;

forming a contact metallization on said epitaxial layer, wherein the contact resistance at the contact metallization is lower than approximately $10^{-7}$ ohm-cm$^2$; wherein said group III–V material is InP.

6. A method for growing group III–V semiconductor material according to claim 3 wherein said silicon tetrabromide is supplied at a rate of between 0.03 and 10 standard cubic centimeters per minute and said epitaxial layer has resulting respective net electron concentrations of between $10^{17}$ and $1.2\times10^{20}$ cm$^{-3}$.

7. A method for growing N-type group III–V semiconductor material for use in a semiconductor device including a substrate and a P or N type regions comprising the steps of:

heating a substrate in a growth reactor chamber;

supplying group III–V precursors to said growth reactor chamber after said step of heating;

supplying a silicon dopant precursor along with said group III–V precursors; and continuing said steps of supplying said group III–V precursors and said silicon dopant precursor to form a region of silicon doped III–V semiconductor material; wherein said silicon dopant precursor incorporates into said region at an efficiency in excess of approximately $10^{-4}$.

8. A method for growing N-type group III–V semiconductor material according to claim 7 wherein said silicon dopant precursor supplies silicon which electrically activates at a rate of nearly 100%.

9. A method for growing N-type group III–V semiconductor material according to claim 7 wherein said silicon dopant precursor is silicon tetrabromide.

10. A method for growing N-type group III–V semiconductor material according to claim 7 wherein said silicon dopant precursor is silicon tetraiodide.

11. A method for growing N-type group III–V semiconductor material according to claim 8 wherein said silicon dopant precursor is silicon tetrabromide.

12. A method for growing N-type group III–V semiconductor material according to claim 8 wherein said silicon dopant precursor is silicon tetraiodide.

13. A method for growing N-type group III–V semiconductor material according to claim 11 further comprising the steps of:

continuing said supplying of said group III–V precursors and said silicon tetrabromide until an epitaxial layer of predetermined thickness is grown;

forming a contact metallization on said epitaxial layer, wherein the contact resistance at the contact metallization is lower than approximately $10^{-7}$ ohm-cm$^2$.

14. A method for growing group III–V semiconductor material according to claim 11 wherein said silicon tetrabromide is supplied at a rate of between 0.03 and 10 standard cubic centimeters per minute and said epitaxial layer has resulting respective net electron concentrations in the approximate range of $10^{17}$ to $1.2\times10^{20}$ cm$^{-3}$.

15. A method for growing group III–V semiconductor material according to claim 17, wherein said group III–V semiconductor material is indium phosphide and said group III–V precursors are indium phosphide precursors.

16. A method for growing N-type group III–V semiconductor material comprising the steps of:

heating a substrate in a growth reactor chamber;

supplying group III–V precursors to said growth reactor chamber; and supplying a silicon dopant precursor to said growth reactor chamber to produce a region of silicon doped group III–V semiconductor material, wherein said silicon dopant precursor is selected from the group consisting of SiBr$_4$ and SiI$_4$.

* * * * *

UNITED STATES PATENT AND TRADEMARK OFFICE
CERTIFICATE OF CORRECTION

PATENT NO. : 5,580,382
DATED : December 3, 1996
INVENTOR(S) : Jackson, et al.

It is certified that error appears in the above-indentified patent and that said Letters Patent is hereby corrected as shown below:

On the Title Page:

[56] References cited, U.S. Patent Documents, delete "Bumhan" and insert --Burnhan-- therefor.

In the Abstract, line 1 delete "An" and insert --A--.

Column 1, line 4, after the title insert --"This invention was made with Government support under Contract No. ECD-8943166 and DMR-8920538 (73) awarded by the National Science Foundation; Contract No. N00014-90-J-1270 awarded by the Department of the Navy; and

UNITED STATES PATENT AND TRADEMARK OFFICE
CERTIFICATE OF CORRECTION

PATENT NO. : 5,580,382
DATED : December 3, 1996
INVENTOR(S) : Jackson, et al.

It is certified that error appears in the above-indentified patent and that said Letters Patent is hereby corrected as shown below:

Contract No. DAAL03-92-G-0272 awarded by the U.S. Army Research Office. The Government has certain rights in the invention"--.

Column 3, line 58, delete "componds" and insert --compounds-- therefor.

Column 5, line 37, delete "for" and insert --forth--.

Column 6, line 28, delete "device" and insert --devices--.

Column 6, line 54, delete "SICl$_4$" and insert --SiCl$_4$-- therefor.

UNITED STATES PATENT AND TRADEMARK OFFICE
CERTIFICATE OF CORRECTION

PATENT NO. : 5,580,382
DATED : December 3, 1996
INVENTOR(S) : Jackson, et al.

It is certified that error appears in the above-indentified patent and that said Letters Patent is hereby corrected as shown below:

Column 7, line 11, delete "In0.53" and insert --$In_{0.53}$-- therefor.

Column 7, line 22, delete "In0.53Ga0.47As" and insert -- $In_{0.53}Ga_{0.47}As$-- therefor.

Column 7, line 28, delete "In0.53Ga0.47As" and insert -- $In_{0.53}Ga_{0.47}As$-- therefor.

Signed and Sealed this

Thirteenth Day of May, 1997

Attest:

BRUCE LEHMAN

Attesting Officer

Commissioner of Patents and Trademarks